(12) United States Patent
Srinivasan et al.

(10) Patent No.: US 6,365,515 B1
(45) Date of Patent: Apr. 2, 2002

(54) CHEMICAL VAPOR DEPOSITION PROCESS

(75) Inventors: Anand Srinivasan, Boise, ID (US); Sujit Sharon, Chandler, AZ (US); Raj Narasimhan, Boise, ID (US)

(73) Assignee: Micron Technology, Inc., Boise, IL (US)

( * ) Notice: Subject to any disclaimer, the term of this patent is extended or adjusted under 35 U.S.C. 154(b) by 0 days.

(21) Appl. No.: 09/649,244

(22) Filed: Aug. 28, 2000

(51) Int. Cl.[7] .......................... H01L 21/44; H01L 21/31
(52) U.S. Cl. ...................... 438/680; 438/683; 438/685; 438/792
(58) Field of Search ................................ 438/685, 682, 438/680, 656, 792, 683

(56) References Cited

U.S. PATENT DOCUMENTS

| | | |
|---|---|---|
| 4,830,891 A | 5/1989 | Nishitani et al. |
| 4,977,106 A | 12/1990 | Smith |
| 5,043,790 A | 8/1991 | Butler |
| 5,173,327 A * | 12/1992 | Sandhu et al. ............... 427/573 |
| 5,250,467 A | 10/1993 | Somekh et al. |
| 5,252,518 A | 10/1993 | Sandhu et al. |
| 5,258,096 A | 11/1993 | Sandhu et al. |
| 5,344,792 A | 9/1994 | Sandhu et al. |
| 5,356,835 A | 10/1994 | Somekh et al. |
| 5,384,289 A | 1/1995 | Westmoreland |
| 5,385,634 A | 1/1995 | Butler et al. |
| 5,478,780 A | 12/1995 | Koerner et al. |
| 5,595,784 A | 1/1997 | Kaim et al. |
| 5,665,640 A | 9/1997 | Foster et al. |
| 5,674,574 A | 10/1997 | Atwell et al. |
| 5,723,382 A | 3/1998 | Sandhu et al. |
| 5,747,384 A | 5/1998 | Miyamoto |
| 6,245,674 B1 * | 6/2001 | Sandhu ........................ 438/674 |
| 6,271,136 B1 * | 8/2001 | Shue et al. .................. 438/687 |

* cited by examiner

Primary Examiner—John F. Niebling
Assistant Examiner—Alexander G. Ghyka
(74) Attorney, Agent, or Firm—Killworth, Gottman, Hagan & Schaeff LLP

(57) ABSTRACT

The present invention relates to chemical vapor deposition processes related to the manufacture of integrated circuit devices. In accordance with one embodiment of the present invention, a process for forming an electrical contact to a silicon substrate is provided wherein a semiconductor wafer is positioned in a reaction chamber wherein the semiconductor wafer includes an insulating layer disposed over a semiconductor substrate, and the insulating layer defines a contact opening therein. The contact opening defines insulating side wall regions therein. The insulating side walls extend from an upper surface region of the insulating layer to an exposed semiconductor region of the semiconductor substrate. A set of reactants are introduced into the reaction chamber, RF plasma is generated in the vicinity of the semiconductor wafer, and the temperature and pressure of the reaction chamber is regulated. The introduction of the reactants, the generation e RF plasma, and the regulation of the temperature and pressure is controlled so as to form a primary film over the upper surface region of the insulating layer over the insulating side wall regions, and over the exposed semiconductor region of the semiconductor substrate. A nitrogen-based gas is introduced into the reaction chamber and a nitridizing RF plasma is generated in the vicinity of the semiconductor wafer so as to nitridize the primary film formed over the upper surface region, the insulating side wall regions, and the exposed semiconductor region. An electrical contact is formed in the contact opening.

42 Claims, 3 Drawing Sheets

CHEMICAL VAPOR DEPOSITION PROCESS

BACKGROUND AND SUMMARY OF THE INVENTION

The present invention relates to chemical vapor deposition processes related to the manufacture of integrated circuit devices. The present inventors have recognized a need for an improved chemical vapor deposition process for use in integrated circuit manufacture and, more particularly, a need for an improved process for forming an electrical contact to a semiconductor substrate.

In accordance with one embodiment of the present invention, a chemical vapor deposition process is provided. A semiconductor wafer is positioned in a reaction chamber. The semiconductor wafer includes an insulating layer disposed over a silicon substrate. The insulating layer defines a contact opening therein, the contact opening defining insulating side wall regions therein, the insulating side walls extending from an upper surface region of the insulating layer to an exposed silicon region of the silicon substrate. A set of reactants are introduced into the reaction chamber. RF plasma is generated in the vicinity of the semiconductor wafer and the temperature and pressure of the reaction chamber are regulated.

The introduction of the reactants, the generation of the RF plasma, and the regulation of the temperature and pressure are controlled so as to form a primary film over the upper surface region of the insulating layer, over the insulating side wall regions, and over the exposed silicon region of the silicon substrate. The primary film is formed over the upper surface region and the insulating side wall regions according to the following chemical reaction $$TiCl_4 + H_2 \rightarrow Ti + A$$

The primary film is formed over the exposed silicon region according to the following chemical reaction $$TiCl_4 + H_2 + Si \rightarrow TiSi + A$$

Si represents silicon present in the silicon substrate and A represents a non-film forming component of the chemical reactions. The primary film is characterized by a first thickness a over the upper surface region and a second thickness b over the exposed silicon region. The first thickness a is substantially less than the second thickness b.

The process may further comprise introducing a nitrogen-based gas into the reaction chamber and generating a nitridizing RF plasma in the vicinity of the semiconductor wafer so as to nitridize the primary film formed over the upper surface region, the insulating side wall regions, and the exposed silicon region. The nitridizing process causes conversion of the primary film formed over the upper surface region and the insulating side wall regions to a TiN layer and formation of a TiN passivation layer over the primary film formed over the exposed silicon region.

The first thickness a may comprise titanium and may be about ½ the magnitude of the second thickness b. The second thickness b of the primary film may comprise TiSi. The temperature of the reaction chamber may be regulated in the range of between about 500° C. and about 700° C. The pressure of the reaction chamber may be regulated in the range of between about 500 Pa and about 700 Pa. The set of reactants may be introduced into the reaction chamber with an inert gas, e.g., helium. The non-film forming component may include HCl, He, and combinations thereof.

The process may further comprise introducing a nitrogen-based gas into the reaction chamber and generating a nitridizing RF plasma in the vicinity of the semiconductor wafer so as to nitridize the primary film formed over the upper surface region, the insulating side wall regions, and the exposed silicon region. The nitridizing process may cause the primary film formed over the upper surface region and the insulating side wall regions to be converted to TiN and may cause the primary film formed over the exposed silicon region to be passivated with a layer of TiN. Prior to introducing the nitrogen-based gas into the reaction chamber, the reaction chamber may be purged of $TiCl_4$.

The exposed silicon region of the silicon substrate typically comprises an active area of a semiconductor device and may, for example, be a diffusion region, a source region of a transistor, a drain region of a transistor, and a collector region of a transistor.

In accordance with another embodiment of the present invention, a chemical vapor deposition process is provided wherein a semiconductor wafer is positioned in a reaction chamber wherein the semiconductor wafer includes an insulating layer disposed over a semiconductor substrate, and the insulating layer defines a contact opening therein. The contact opening defines insulating side wall regions therein. The insulating side walls extend from an upper surface region of the insulating layer to an exposed semiconductor region of the semiconductor substrate. A set of reactants are introduced into the reaction chamber, RF plasma is generated in the vicinity of the semiconductor wafer, and the temperature and pressure of the reaction chamber is regulated.

The introduction of the reactants, the generation of the RF plasma, and the regulation of the temperature and pressure is controlled so as to form a primary film over the upper surface region of the insulating layer, over the insulating side wall regions, and over the exposed semiconductor region of the semiconductor substrate. A nitrogen-based gas is introduced into the reaction chamber and a nitridizing RF plasma is generated in the vicinity of the semiconductor wafer so as to nitridize the primary film formed over the upper surface region, the insulating side wall regions, and the exposed semiconductor region.

In accordance with yet another embodiment of the present invention, a chemical vapor deposition process is provided wherein a semiconductor wafer is positioned in a reaction chamber. The semiconductor wafer includes an insulating layer disposed over a silicon substrate and the insulating layer defines a contact opening therein. The contact opening defines insulating side wall regions therein, the insulating side walls extend from an upper surface region of the insulating layer to an exposed silicon region of the silicon substrate. A set of reactants are introduced into the reaction chamber, RF plasma is generated in the vicinity of the semiconductor wafer, and the temperature and pressure of the reaction chamber are regulated. The RF plasma is generated at a power of about 1000 W and the temperature of the reaction chamber is regulated in the range of between about 500° C. and about 700° C.

The introduction of the reactants, the generation of the RF plasma, and the regulation of the temperature and pressure is controlled so as to form a primary film over the upper surface region of the insulating layer, over the insulating side wall regions, and over the exposed silicon region of the silicon substrate. The primary film is formed over the upper surface region and the insulating side wall regions according to the following chemical reaction $TiCl_4 + H_2 \rightarrow Ti + A$ The primary film is formed over the exposed silicon region according to the following chemical reaction $TiCl_4 + H_2 + Si \rightarrow TiSi + A$ Si represents silicon present in the silicon substrate and A represents a non-film forming component of the chemical reactions, wherein the primary film is characterized by a first thickness a over the upper surface region and a second thickness b over the exposed silicon region, and wherein the first thickness a is substantially less than the second thickness b.

In accordance with yet another embodiment of the present invention, a chemical vapor deposition process is provided wherein a semiconductor wafer is positioned in a reaction chamber. The semiconductor wafer includes an insulating layer disposed over a silicon substrate and the insulating layer defines a contact opening therein. The contact opening defines insulating side wall regions therein, the insulating side walls extend from an upper surface region of the insulating layer to an exposed silicon region of the silicon substrate. A set of reactants are introduced into the reaction chamber, RF plasma is generated in the vicinity of the semiconductor wafer, and the temperature and pressure of the reaction chamber is regulated. The RF plasma is generated at a power of about 1000 W and the temperature of the reaction chamber is regulated in the range of between about 500° C. and about 700° C. The introduction of the reactants, the generation of the RF plasma, and the regulation of the temperature and pressure is controlled so as to form a Ti film over the upper surface region of the insulating layer and over the insulating side wall regions and so as to form a TiSi film over the exposed silicon region of the silicon substrate. The primary film is characterized by a first thickness a over the upper surface region and a second thickness b over the exposed silicon region. The first thickness a is substantially less than the second thickness b.

In accordance with yet another embodiment of the present invention, a process for forming an electrical contact to a silicon substrate is provided wherein a semiconductor wafer is positioned in a reaction chamber. The semiconductor wafer includes an insulating layer disposed over a silicon substrate. The insulating layer defines a contact opening therein, the contact opening defining insulating side wall regions therein, the insulating side walls extending from an upper surface region of the insulating layer to an exposed silicon region of the silicon substrate. A set of reactants are introduced into the reaction chamber. RF plasma is generated in the vicinity of the semiconductor wafer and the temperature and pressure of the reaction chamber are regulated.

The introduction of the reactants, the generation of the RF plasma, and the regulation of the temperature and pressure are controlled so as to form a primary film over the upper surface region of the insulating layer, over the insulating side wall regions, and over the exposed silicon region of the silicon substrate. The primary film is formed over the upper surface region and the insulating side wall regions according to the following chemical reaction $TiCl_4 + H_2 \rightarrow Ti + A$ The primary film is formed over the exposed silicon region according to the following chemical reaction $TiCl_4 + H_2 + Si \rightarrow TiSi + A$ Si represents silicon present in the silicon substrate and A represents a non-film forming component of the chemical reactions. The primary film is characterized by a first thickness a over the upper surface region and a second thickness b over the exposed silicon region. The first thickness a is substantially less than the second thickness b. An electrical contact is formed in the contact opening.

A nitrogen-based gas may be introduced into the reaction chamber and a nitridizing RF plasma may be generated in the vicinity of the semiconductor wafer so as to nitridize the primary film formed over the upper surface region, the insulating side wall regions, and the exposed silicon region. The nitridizing process may cause conversion of the primary film formed over the upper surface region and the insulating side wall regions to a TiN layer, and formation of a TiN passivation layer over the primary film formed over the exposed silicon region.

The electrical contact may be formed by depositing a layer of conductive material over the primary film formed over the upper surface region and in the contact opening over the primary film and removing the portion of the layer of conductive material overlying the portion of the primary film overlying the upper surface region. The removal of the portion of the layer of conductive material is characterized by a process that is substantially less effective in removing the primary film. The portion of the primary film is removed following removal of the conductive material.

The electrical contact may be formed by depositing a layer of conductive material over the portion of the primary film overlying the upper surface region and in the contact opening over the primary film. The electrical contact may further be formed by removing the portion of the layer of conductive material overlying the portion of the primary film overlying the upper surface region. The removal of the portion of the layer of conductive material is characterized by a process that is substantially less effective in removing the primary film. The portion of the primary film overlying the upper surface region may be removed following removal of the conductive material.

In accordance with yet another embodiment of the present invention, a process for forming an electrical contact to a silicon substrate is provided wherein a semiconductor wafer is positioned in a reaction chamber wherein the semiconductor wafer includes an insulating layer disposed over a semiconductor substrate, and the insulating layer defines a contact opening therein. The contact opening defines insulating side wall regions therein. The insulating side walls extend from an upper surface region of the insulating layer to an exposed semiconductor region of the semiconductor substrate. A set of reactants are introduced into the reaction chamber, RF plasma is generated in the vicinity of the semiconductor wafer, and the temperature and pressure of the reaction chamber is regulated.

The introduction of the reactants, the generation of the RF plasma, and the regulation of the temperature and pressure is controlled so as to form a primary film over the upper surface region of the insulating layer, over the insulating side wall regions, and over the exposed semiconductor region of the semiconductor substrate. A nitrogen-based gas is introduced into the reaction chamber and a nitridizing RF plasma is generated in the vicinity of the semiconductor wafer so as to nitridize the primary film formed over the upper surface region, the insulating side wall regions, and the exposed semiconductor region. An electrical contact is formed in the contact opening.

The electrical contact may be formed by depositing a layer of conductive material over the portion of the primary film overlying the upper surface region and in the contact opening over the primary film. The portion of the layer of conductive material overlying the portion of the primary film overlying the upper surface region may be removed. The removal of the portion of the layer of conductive material may be characterized by a process that is substantially less effective in removing the primary film. The portion of the primary film is removed following removal of the conductive material.

In accordance with yet another embodiment of the present invention, a process for forming an electrical contact to a silicon substrate is provided wherein a semiconductor wafer is positioned in a reaction chamber. The semiconductor wafer includes an insulating layer disposed over a silicon substrate and the insulating layer defines a contact opening therein. The contact opening defines insulating side wall regions therein, the insulating side walls extend from an upper surface region of the insulating layer to an exposed silicon region of the silicon substrate. A set of reactants are introduced into the reaction chamber, RF plasma is generated in the vicinity of the semiconductor wafer, and the temperature and pressure of the reaction chamber are regulated. The RF plasma is generated at a power of about 1000 W and the temperature of the reaction chamber is regulated in the range of between about 500° C. and about 700° C.

The introduction of the reactants, the generation of the RF plasma, and the regulation of the temperature and pressure is controlled so as to form a primary film over the upper surface region of the insulating layer, over the insulating side wall regions, and over the exposed silicon region of the silicon substrate. The primary film is formed over the upper surface region and the insulating side wall regions according to the following chemical reaction

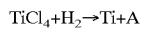

$TiCl_4 + H_2 \rightarrow Ti + A$

The primary film is formed over the exposed silicon region according to the following chemical reaction

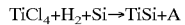

$TiCl_4 + H_2 + Si \rightarrow TiSi + A$

Si represents silicon present in the silicon substrate and A represents a non-film forming component of the chemical reactions, wherein the primary film is characterized by a first thickness a over the upper surface region and a second thickness b over the exposed silicon region, and wherein the first thickness a is substantially less than the second thickness b.

In accordance with yet another embodiment of the present invention, a process for forming an electrical contact to a silicon substrate is provided wherein a semiconductor wafer is positioned in a reaction chamber. The semiconductor wafer includes an insulating layer disposed over a silicon substrate and the insulating layer defines a contact opening therein. The contact opening defines insulating side wall regions therein, the insulating side walls extend from an upper surface region of the insulating layer to an exposed silicon region of the silicon substrate. A set of reactants are introduced into the reaction chamber, RF plasma is generated in the vicinity of the semiconductor wafer, and the temperature and pressure of the reaction chamber is regulated. The RF plasma is generated at a power of about 1000 W and the temperature of the reaction chamber is regulated in the range of between about 500° C. and about 700° C. The introduction of the reactants, the generation of the RF plasma, and the regulation of the temperature and pressure is controlled so as to form a Ti film over the upper surface region of the insulating layer and over the insulating side wall regions and so as to form a TiSi film over the exposed silicon region of the silicon substrate. The primary film is characterized by a first thickness a over the upper surface region and a second thickness b over the exposed silicon region. The first thickness a is substantially less than the second thickness b.

Accordingly, it is an object of the present invention to provide an improved chemical vapor deposition process and, more particularly, an improved process for forming an electrical contact to a semiconductor substrate. Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION OF THE PREFERRED EMBODIMENTS

An improved chemical vapor deposition process and, more particularly, an improved process for forming an electrical contact to a semiconductor substrate are illustrated in FIGS. 1–6. In order to provide a clear illustration of the invention, the dimensions of the various material layers illustrated in FIGS. 1–6 are not presented to scale. Similarly, the profiles and surface topography of the various material layers illustrated in FIGS. 1–6 have been made artificially uniform to preserve clarity of illustration.

Figure 1:
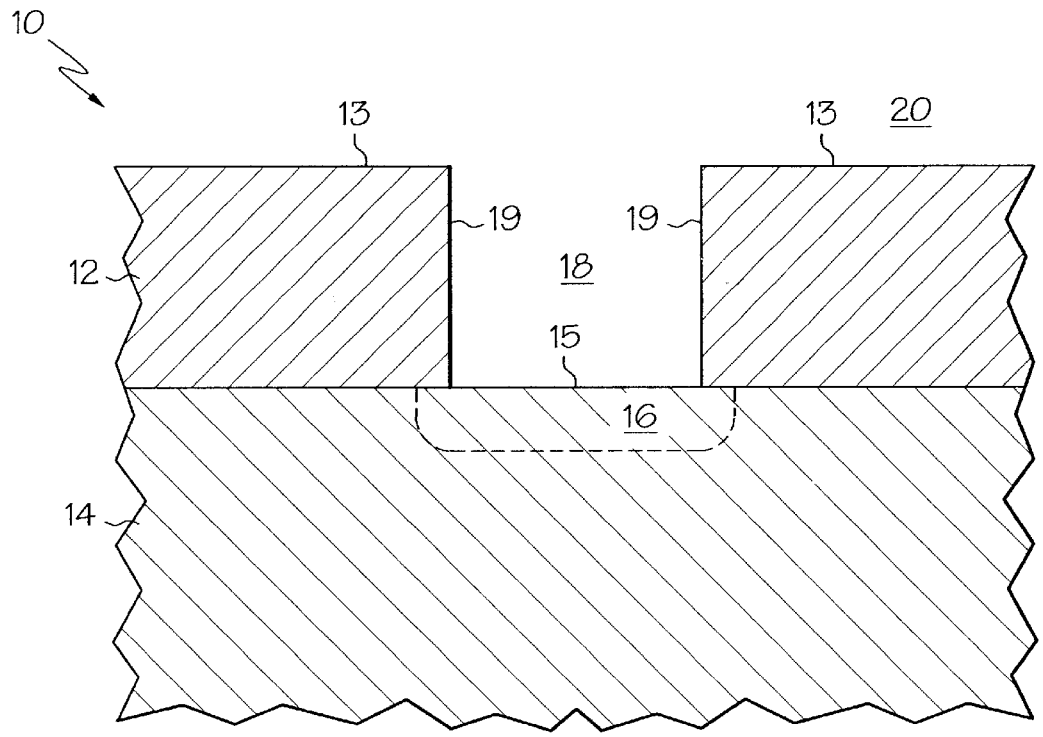
FIGS. 1–6 illustrate a chemical vapor deposition and electrical connection formation process according to the present invention.

Referring initially to FIG. 1, a semiconductor wafer 10 including an insulating layer 12 disposed over a silicon substrate 14 is positioned in a reaction chamber 20. The silicon substrate 14 includes an active area 16 formed therein. The active area 16 may, for example, comprise a diffusion region, a source, drain, or collector region of a transistor.

The insulating layer 12 defines a contact opening 18 therein. The contact opening 18 defines insulating side walls 19 extending from an upper surface region 13 of the insulating layer 12 to an exposed silicon region 15 of the silicon substrate 14. The dimensions of the contact hole 18 illustrated in the figures of the present application are not presented to scale. Typically, the contact hole 18 would have a greater depth and smaller width than that illustrated.

A set of reactants and an inert gas are introduced into the reaction chamber 20 and an RF plasma is generated in the vicinity of the semiconductor wafer 10. The particular arrangement of the reaction chamber and the RF source are beyond the scope of the present invention and may be gleaned from conventional RF plasma enhanced chemical vapor deposition arrangements, such as those described in U.S. Pat. Nos. 5,665,640 and 5,173,327, the disclosures of which are incorporated herein by reference.

In one embodiment of the present invention, the temperature of the reaction chamber is regulated in the range of between about 500° C. and about 700° C. The pressure of the reaction chamber is regulated in the range of between about 500 Pa and about 700 Pa. The set of reactants are introduced into the reaction chamber with an inert gas, such as helium.

Although the present invention is illustrated herein with specific reference to a silicon semiconductor substrate 14 and a titanium-based primary film 22, it is contemplated by the present invention that other semiconductor and film materials may be utilized according to the present invention.

For the purposes of describing and defining the present invention, formation of a material, layer, or film "on" a substrate or layer refers to formation in contact with a surface of the substrate or layer. Formation "over" a substrate or layer refers to formation above a surface of the substrate or layer, in contact with a surface of the substrate or layer, partially above and partially within the interior of the substrate or layer, or within the substrate at the surface of the substrate or layer.

Figure 2:
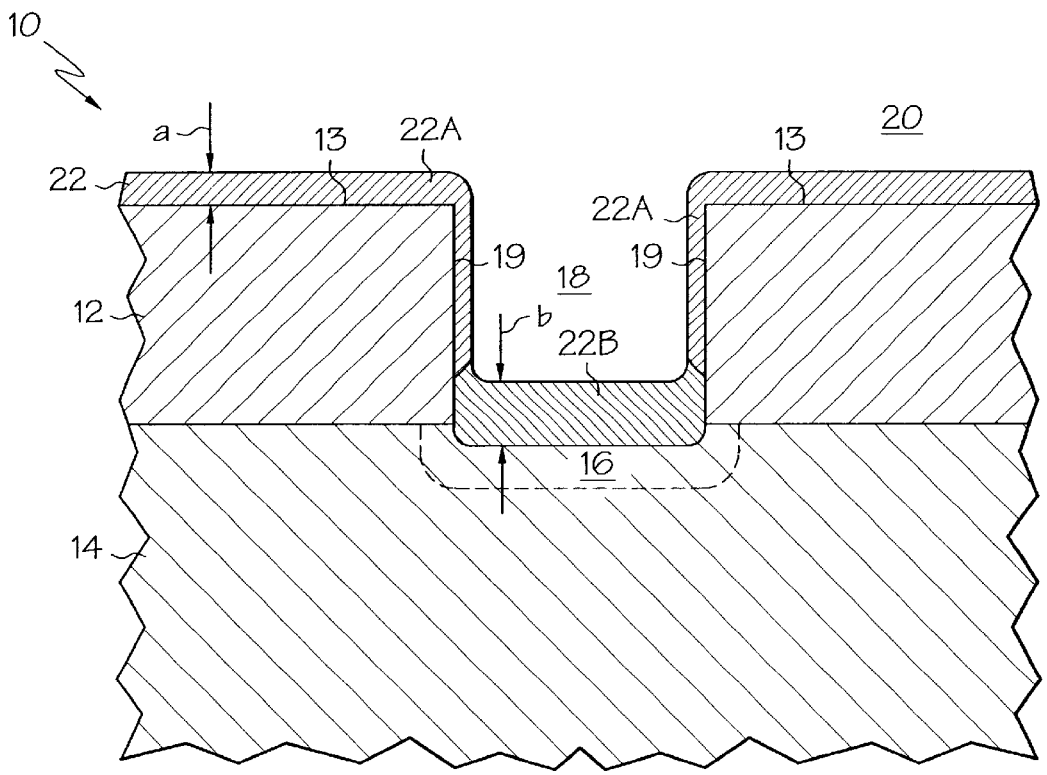

Referring now to FIG. 2, the introduction of the reactants, the generation of the RF plasma, and the regulation of the temperature and pressure are controlled so as to form a primary film 22 over (i) the upper surface region 13 of the insulating layer 12, (ii) the insulating side wall regions 19, and (iii) the exposed silicon region 15 of the silicon substrate 14. The primary film 22 is formed over the upper surface region 13 and the insulating side wall regions 19 according to the following chemical reaction

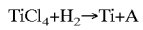

In contrast, the primary film 22 is formed over the exposed silicon region 15 according to the following chemical reaction

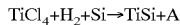

Si represents silicon present in the silicon substrate and A represents a non-film forming component of the chemical reactions (e.g., HCl). Non-film forming components include HCl and He.

The two different portions of the primary film 22 are illustrated in FIGS. 2–6 as 22A and 22B. This selective deposition process leads to formation of a primary film 22 characterized by a first thickness a over the upper surface region 13 and a second thickness b over the exposed silicon region. Because the reaction is selective, the first thickness a is substantially less than the second thickness b. Typically, the first thickness a is about ½the magnitude of the second thickness b.

As is clearly illustrated in FIGS. 2–6, the two different portions 22A and 22B of the primary film 22 define collectively a non-uniform thickness.

Figure 3:
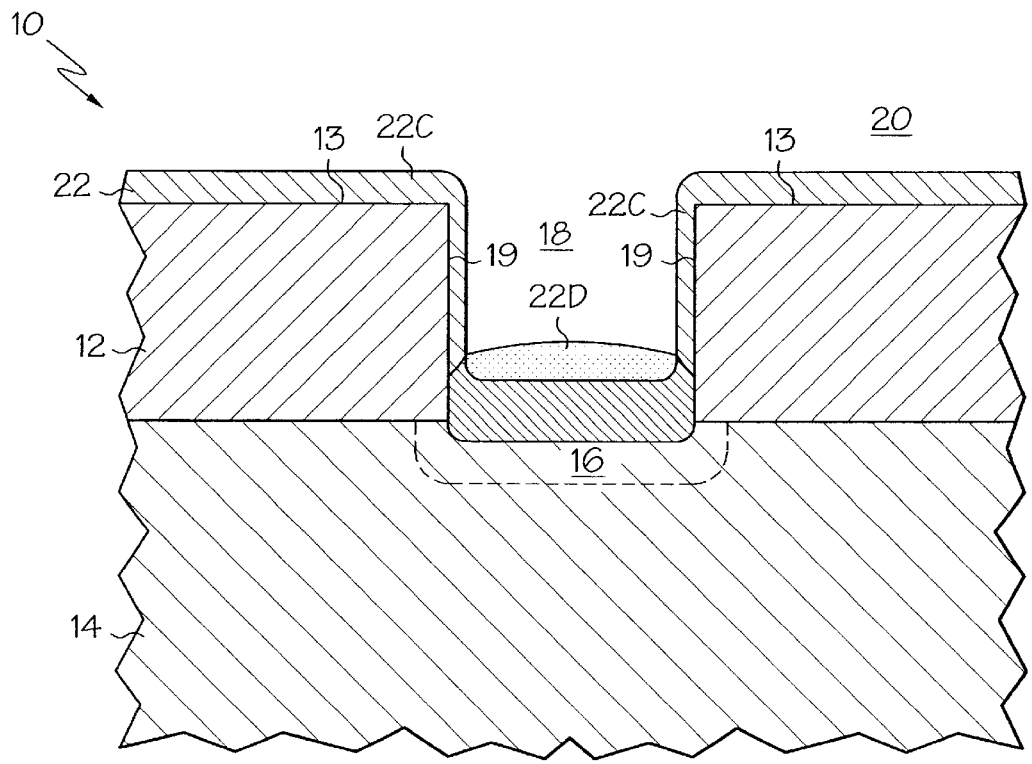

After formation of the primary film 22, the reaction chamber 20 is purged of $TiCl_4$ and the primary film 22 is nitridized by introducing a nitrogen-based gas into the reaction chamber 20 and generating a nitridizing RF plasma in the vicinity of the semiconductor wafer 10. As is illustrated in FIG. 3, where the primary film 22 comprises Ti and TiSi, this nitridizing process causes conversion of the primary film 22 formed over the upper surface region 13 and the insulating side wall regions 19 to a TiN layer 22C and formation of a TiN passivation layer 22D over the primary film 22 formed over the exposed silicon region 15.

Figure 4:
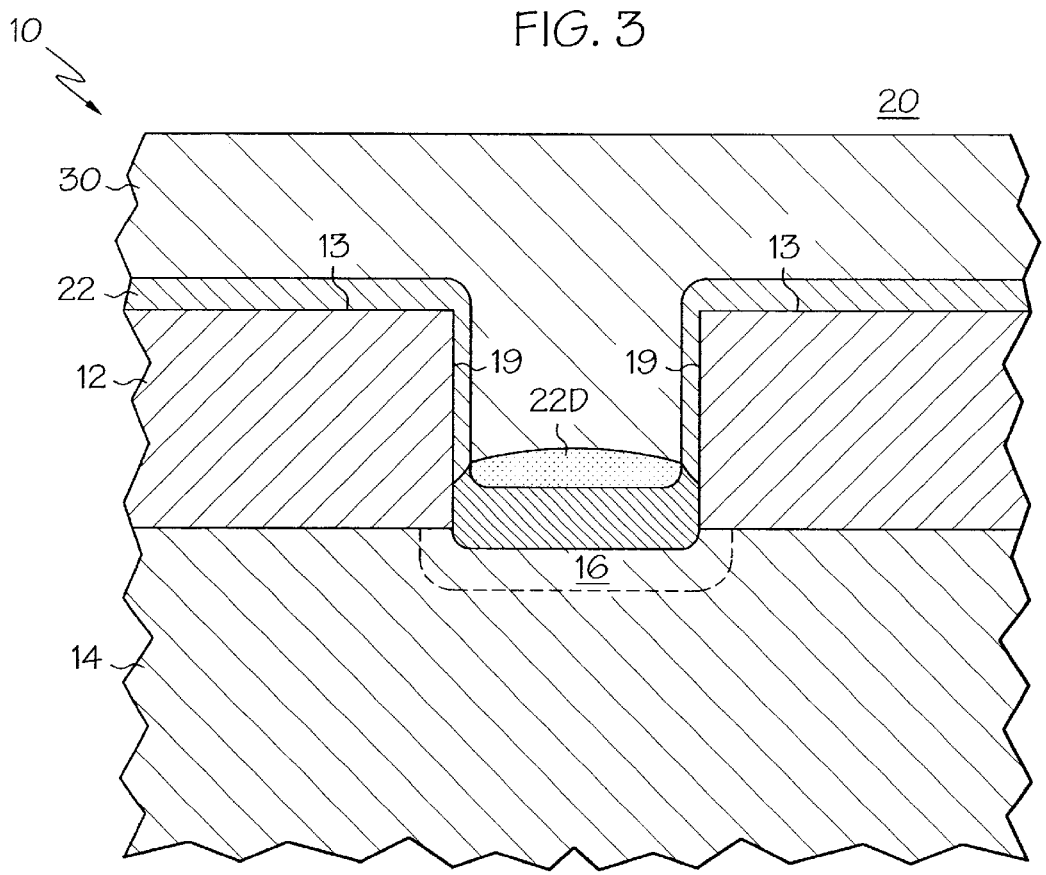
Figure 5:
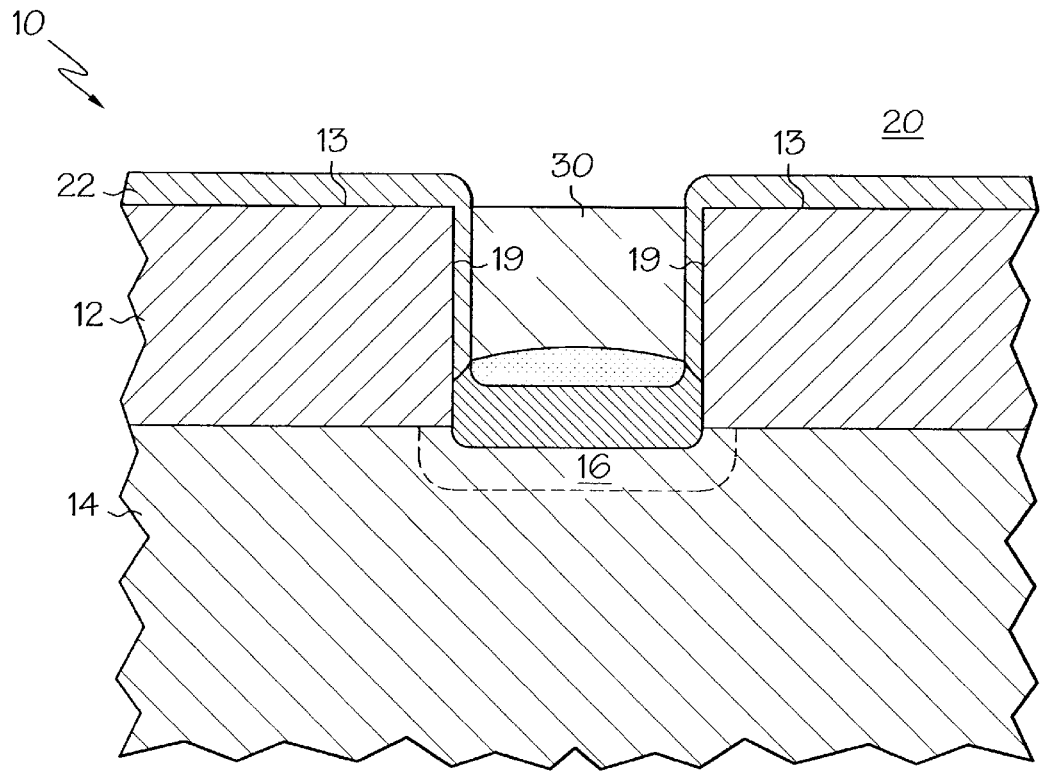
Figure 6:
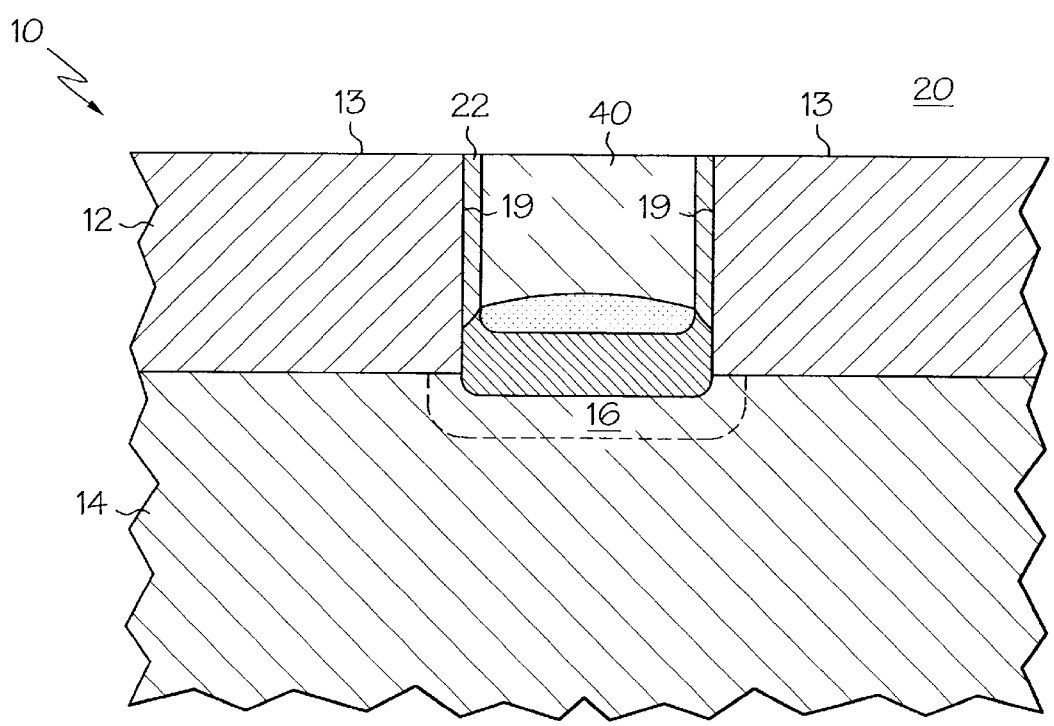

Referring now to FIGS. 4–6 a manner of forming an electrical contact 40 in the contact opening 18 is illustrated. According to one embodiment of the present invention, the electrical contact is formed by initially depositing a layer of conductive material 30 over the converted/passivated primary film 22 and in the contact opening 18. In one embodiment of the present invention, the conductive material 30 comprises $WSi_x$. The Si content of the $WSi_x$ may be enhanced to minimize any reactions with the TiSi or the TiN. Other suitable conductive materials include, and are not limited to, other tungsten-based materials, including pure tungsten.

Next, the portion of the layer of conductive material 30 overlying the converted primary film 22 over the upper surface region 13 is removed, typically through an etching process (see FIG. 5). The removal of the portion of the layer of conductive material 30 overlying the converted primary film 22 over the upper surface region 13 is characterized by a process that is substantially less effective in removing the converted primary film 22. In this manner, the converted primary film 22 protects the insulating layer during removal of the conductive material 30. The preferred process for removal is specific to the material used for the conductive material 30 and the converted primary film 22 over the upper surface region 13. For the purposes of describing and defining the present invention, a process that is "substantially" less effective in removing the converted primary film 22 than in removing the conductive film is a process that leaves enough of the converted primary film 22 to protect the insulating layer during removal of the conductive material 30. The converted primary film 22 over the upper surface region 13 is removed following removal of the portion of the layer of conductive material 30 (see FIG. 6).

Having described the invention in detail and by reference to preferred embodiments thereof, it will be apparent that modifications and variations are possible without departing from the scope of the invention defined in the appended claims.

What is claimed is:

1. A chemical vapor deposition process, wherein a semiconductor wafer is positioned in a reaction chamber, said semiconductor wafer including an insulating layer disposed over a silicon substrate and said insulating layer defining a contact opening therein, said contact opening defining insulating side wall regions therein, said insulating side walls extending from an upper surface region of said insulating layer to an exposed silicon region of said silicon substrate, said process comprising:

introducing a set of reactants into said reaction chamber;

generating a RF plasma in the vicinity of said semiconductor wafer and regulating temperature and pressure of said reaction chamber; and controlling said introduction of said reactants, said generation of said RF plasma, and said regulation of said temperature and pressure so as to form a primary film over said upper surface region of said insulating layer, over said insulating side wall regions, and over said exposed silicon region of said silicon substrate, wherein said primary film is formed over said upper surface region and said insulating side wall regions according to the following chemical reaction

wherein said primary film is formed over said exposed silicon region according to the following chemical reaction

where Si represents silicon present in said silicon substrate and A represents a non-film forming component of said chemical reactions, wherein said primary film is characterized by a first thickness a over said upper surface region and a second thickness b over said exposed silicon region, and wherein said first thickness a is less than said second thickness b.

2. A chemical vapor deposition process as claimed in claim 1 wherein said process further comprises:

introducing a nitrogen-based gas into said reaction chamber; and generating a nitridizing RF plasma in the vicinity of said semiconductor wafer so as to nitridize said primary film formed over said upper surface regional, said insulating side wall regions, and said exposed silicon region, wherein said nitridizing process causes conversion of said primary film formed over said upper surface region and said insulating side wall regions to a TiN layer, and said nitridizing process causes formation of a TiN passivation layer over said primary film formed over said exposed silicon region.

3. A chemical vapor deposition process as claimed in claim 1 wherein said first thickness a is about ½ the magnitude of said second thickness b.

4. A chemical vapor deposition process as claimed in claim 1 wherein said first thickness a of said primary film comprises titanium.

5. A chemical vapor deposition process as claimed in claim 1 wherein said second thickness b of said primary film comprises TiSi.

6. A chemical vapor deposition process as claimed in claim 1 wherein said temperature of said reaction chamber is regulated in the range of between about 500° C. and about 700° C. and wherein said pressure of said reaction chamber is regulated in the range of between about 500 Pa and about 700 Pa.

7. A chemical vapor deposition process as claimed in claim 1 wherein said temperature of said reaction chamber is regulated in the range of between about 500° C. and about 700° C.

8. A chemical vapor deposition process as claimed in claim 1 wherein said pressure of said reaction chamber is regulated in the range of between about 500 Pa and about 700 Pa.

9. A chemical vapor deposition process as claimed in claim 1 wherein said set of reactants are introduced into said reaction chamber with an inert gas.

10. A chemical vapor deposition process as claimed in claim 9 wherein said inert gas comprises helium.

11. A chemical vapor deposition process as claimed in claim 1 wherein said non-film forming component is selected from HCl, He, and combinations thereof.

12. A chemical vapor deposition process as claimed in claim 1 wherein said process further comprises:

introducing a nitrogen-based gas into said reaction chamber; and generating a nitridizing RF plasma in the vicinity of said semiconductor wafer so as to nitridize said primary film formed over said upper surface region, said insulating side wall regions, and said exposed silicon region.

13. A chemical vapor deposition process as claimed in claim 12 wherein said nitridizing process causes said primary film formed over said upper surface region and said insulating side wall regions to be converted to TiN.

14. A chemical vapor deposition process as claimed in claim 12 wherein said nitridizing process causes said primary film formed over said exposed silicon region to be passivated with a layer of TiN.

15. A chemical vapor deposition process as claimed in claim 12 further comprising the step of purging said reaction chamber of $TiCl_4$ prior to introducing said nitrogen-based gas into said reaction chamber.

16. A chemical vapor deposition process as claimed in claim 1 further comprising the step of providing said exposed silicon region of said silicon substrate as an active area of a semiconductor device.

17. A chemical vapor deposition process as claimed in claim 16 wherein said active area comprises an active area selected from a group including a diffusion region, a source region of a transistor, a drain region of a transistor, and a collector region of a transistor.

18. A chemical vapor deposition process, wherein a semiconductor wafer is positioned in a reaction chamber, said semiconductor wafer including an insulating layer disposed over a semiconductor substrate and said insulating layer defining a contact opening therein, said contact opening defining insulating side wall regions therein, said insulating side walls extending from an upper surface region of said insulating layer to an exposed semiconductor region of said semiconductor substrate, said process comprising:

introducing a set of reactants into said reaction chamber;

generating a RF plasma in the vicinity of said semiconductor wafer and regulating temperature and pressure of said reaction chamber;

controlling said introduction of said reactants, said generation of said RF plasma, and said regulation of said temperature and pressure so as to form a primary film over said upper surface region of said insulating layer, over said insulating side wall regions, and over said exposed semiconductor region of said semiconductor substrate;

introducing a nitrogen-based gas into said reaction chamber; and generating a nitridizing RF plasma in the vicinity of said semiconductor wafer so as to nitridize said primary film formed over said upper surface region, said insulating side wall regions, and said exposed semiconductor region.

19. A chemical vapor deposition process, wherein a semiconductor wafer is positioned in a reaction chamber, said semiconductor wafer including an insulating layer disposed over a silicon substrate and said insulating layer defining a contact opening therein, said contact opening defining insulating side wall regions therein, said insulating side walls extending from an upper surface region of said insulating layer to an exposed silicon region of said silicon substrate, said process comprising:

introducing a set of reactants into said reaction chamber;

generating a RF plasma in the vicinity of said semiconductor wafer and regulating temperature and pressure of said reaction chamber, wherein said RF plasma is generated at power of about 1000 W and said temperature of said reaction chamber is regulated in the range of between about 500° C. and about 700° C.; and controlling said introduction of said reactants, said generation of said RF plasma, and said regulation of said temperature and pressure so as to form a primary film over said upper surface region of said insulating layer, over said insulating side wall regions,and over said exposed silicon region of said silicon substrate, wherein said primary film is formed over said upper surface region and said insulating side wall regions according to the following chemical reaction

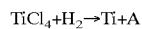

wherein said primary film is formed over said exposed silicon region according to the following chemical reaction

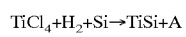

where Si represents silicon present in said silicon substrate and A represents a non-film forming component of said chemical reactions, wherein said primary film is characterized by a first thickness a over said upper surface region and a second thickness b over said exposed silicon region, and wherein said first thickness a is less than said second thickness b.

20. A chemical vapor deposition process as claimed in claim 19 wherein said process further comprises:

introducing a nitrogen-based gas into said reaction chamber; and generating a nitridizing RF plasma in the vicinity of said semiconductor wafer so as to nitridize said primary film formed over said upper surface region, said insulating side wall regions, and said exposed silicon region, wherein
said nitridizing process causes conversion of said primary film formed over said upper surface region and said insulating side wall regions to a TiN layer, and
said nitridizing process causes formation of a TiN passivation layer over said primary film formed over said exposed silicon region.

21. A chemical vapor deposition process, wherein a semiconductor wafer is positioned in a reaction chamber, said semiconductor wafer including an insulating layer disposed over a silicon substrate and said insulating layer defining a contact opening therein, said contact opening defining insulating side wall regions therein, said insulating side walls extending from an upper surface region of said insulating layer to and exposed silicon region of said silicon substrate, said process comprising:

introducing a set of reactants into said reaction chamber;

generating a RF plasma in the vicinity of said semiconductor wafer and regulating temperature and pressure of said reaction chamber, wherein said RF plasma is generated at a power of about 1000 W and said temperature of said reaction chamber is regulated in the range of between 500° C. and about 700° C.; and controlling said introduction of said reactants, said generation of said RF plasma, and said regulation of said temperature and pressure so as to form a Ti film over said upper surface region of said insulating layer and over said insulating side wall regions and so as to form a TiSi film over said exposed silicon region of said silicon substrate, wherein said primary film is characterized by a first thickness a over said upper surface region and a second thickness b over said exposed silicon region, and wherein said first thickness a is less than said second thickness b.

22. A chemical vapor deposition process as claimed in claim 21 wherein said process further comprises:

introducing a nitrogen-based gas into said reaction chamber; and generating a nitridizing RF plasma in the vicinity of said semiconductor wafer so as to nitridize said primary film formed over said upper surface region, said insulating side wall regions, and said exposed silicon region, wherein
said nitridizing process causes conversion of said primary film formed over said upper surface region and said insulating side wall regions to a TiN layer, and
said nitridizing process causes formation of a TiN passivation layer over said primary film formed over said exposed silicon region.

23. A chemical vapor deposition process, wherein a semiconductor wafer is positioned in a reaction chamber, said semiconductor wafer including an insulating layer disposed over a silicon substrate and said insulating layer defining a contact opening therein, said contact opening defining insulating side wall regions therein, said insulating side walls extending from an upper surface region of said insulating to an exposed silicon region of said silicon substrate, said process comprising:

introducing a set of reactants and an inert gas into said reaction chamber;

generating a RF plasma in the vicinity of said semiconductor wafer and regulating temperature and pressure of said reaction chamber, wherein said RF plasma is generated at a power of about 1000 W and said temperature of said reaction chamber is regulated in the range of between about 500° C. and about 700° C.;

controlling said introduction of said reactants, said generation of said RF plasma, and said regulation of said temperature and pressure so as to form a primary film over said upper surface region of said insulating layer, over said insulating side wall regions, and over said exposed silicon region of said silicon substrate, wherein said primary film is formed over said upper surface region and said insulating side wall regions according to the following chemical reaction

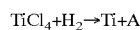

$$TiCl_4 + H_2 \rightarrow Ti + A$$

wherein said primary film is formed over said exposed silicon region according to the following chemical reaction

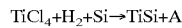

$$TiCl_4 + H_2 + Si \rightarrow TiSi + A$$

where Si represents silicon present in said silicon substrate and A represents a non-film forming component of said chemical reactions, wherein said primary film is characterized by a fist thickness a over said upper surface region and a second thickness b over said exposed silicon region, and wherein said first thickness a is less than said second thickness b;

purging said reaction chamber of $TiCl_4$;

introducing a nitrogen-based gas into said reaction chamber; and generating a nitridizing RF plasma in the vicinity of said semiconductor wafer so as to nitridize said primary film formed over said upper surface region, said insulating side wall regions, and said exposed silicon region, wherein
said nitridizing process causes conversion of said primary film formed over said upper surface region and said insulating side wall regions to a TiN layer, and
said nitridizing process causes formation of a TiN passivation layer over said primary film formed over said exposed silicon region.

24. A process for forming an electrical contact to a silicon substrate, wherein a semiconductor wafer is positioned in a reaction chamber, said semiconductor wafer including an insulating layer disposed over a silicon substrate and said insulating layer defining a contact opening therein, said contact opening defining insulating side wall regions therein, said insulating side walls extending from an upper surface region of said insulating layer to an exposed silicon region of said silicon substrate, said process comprising:

introducing a set of reactants into said reaction chamber;

generating a RF plasma in the vicinity of said semiconductor wafer and regulating temperature and pressure of said reaction chamber;

controlling said introduction of said reactants, said generation of said RF plasma, and said regulation of said temperature and pressure so as to form a primary film over said upper surface region of said insulating layer, over said insulating side wall regions, and over said exposed silicon region of said silicon substrate, wherein said primary film is formed over said upper surface region and said insulating side wall regions according to the following chemical reaction $$TiCl_4 + H_2 \rightarrow Ti + A$$

wherein said primary film is formed over said exposed silicon region according to the following chemical reaction $$TiCl_4 + H_2 + Si \rightarrow TiSi + A$$

where Si represents silicon present in said silicon substrate and A represents a non-film forming component of said chemical reactions, wherein said primary film is characterized by a first thickness a over said upper surface region and a second thickness b over said exposed silicon region, and wherein said first thickness a is less than said second thickness b; and forming an electrical contact in said contact opening.

25. A process for forming an electrical contact to a silicon substrate as claimed in claim 24 wherein said process further comprises:

introducing a nitrogen-based gas into said reaction chamber; and generating a nitridizing RF plasma in the vicinity of said semiconductor wafer so as to nitridize said primary film formed over said upper surface region, said insulating side wall regions, and said exposed silicon region, wherein said nitridizing process causes conversion of said primary film formed over said upper surface region and said insulating side wall regions to a TiN layer, and said nitridizing process causes formation of a TiN passivation layer over said primary film formed over said exposed silicon region.

26. A process for forming an electrical contact to a silicon substrate as claimed in claim 24 wherein said electrical contact is formed by:

depositing a layer of conductive material over said primary film formed over said upper surface region and in said contact opening over said primary film;

removing the portion of said layer of conductive material overlying said portion of said primary film overlying said upper surface region, wherein said removal of said portion of said layer of conductive material is characterized by a process that is substantially less effective in removing said primary film; and removing said portion of said primary film following removal of said conductive material.

27. A process for forming an electrical contact to a silicon substrate as claimed in claim 24 wherein said electrical contact is formed by depositing a layer of conductive material over said portion of said primary film overlying said upper surface region and in said contact opening over said primary film.

28. A process for forming an electrical contact to a silicon substrate as claimed in claim 27 wherein said electrical contact is further formed by removing the portion of said layer of conductive material overlying said portion of said primary film overlying said upper surface region.

29. A process for forming an electrical contact to a silicon substrate as claimed in claim 28 wherein said removal of said portion of said layer of conductive material is characterized by a process that is substantially less effective in removing said primary film.

30. A process for forming an electrical contact to a silicon substrate as claimed in claim 28 wherein said portion of said primary film overlying said upper surface region is removed following removal of said conductive material.

31. A process for forming an electrical contact to a silicon substrate as claimed in claim 24 further comprising the step of providing said exposed silicon region of said silicon substrate as an active area of a semiconductor device.

32. A process for forming an electrical contact to a silicon substrate as claimed in claim 31 further comprising the step of providing said active area as an active area selected from a group including a diffusion region, a source region of a transistor, a drain region of a transistor, and a collector region of a transistor.

33. A process for forming an electrical contact to a semiconductor substrate, wherein a semiconductor wafer is positioned in a reaction chamber, said semiconductor wafer including an insulating layer disposed over a semiconductor substrate and said insulating layer defining a contact opening therein, said contact opening defining insulating side wall regions therein, said insulating side walls extending from an upper surface region of said insulating layer to an exposed semiconductor region of said semiconductor substrate, said process comprising:

introducing a set of reactants into said reaction chamber;

generating a RF plasma in the vicinity of said semiconductor wafer and regulating temperature and pressure of said reaction chamber;

controlling said introduction of said reactants, said generation of said RF plasma, and said regulation of said temperature and pressure so as to form a primary film over said upper surface region of said insulating layer, over said insulating side wall regions, and over said exposed semiconductor region of said semiconductor substrate;

introducing a nitrogen-based gas into said reaction chamber;

generating a nitridizing RF plasma in the vicinity of said semiconductor wafer so as to nitridize said primary film formed over said upper surface region, said insulating side wall regions, and said exposed semiconductor region; and forming an electrical contact in said contact opening.

34. A process for forming an electrical contact to a silicon substrate as claimed in claim 33 wherein said electrical contact is formed by:

depositing a layer of conductive material over said portion of said primary film overlying said upper surface region and in said contact opening over said primary film;

removing the portion of said layer of conductive material overlying said portion of said primary film overlying said upper surface region, wherein said removal of said portion of said layer of conductive material is characterized by a process that is substantially less effective in removing said primary film; and removing said portion of said primary film following removal of said conductive material.

35. A process for forming an electrical contact to a silicon substrate, wherein a semiconductor wafer is positioned in a reaction chamber, said semiconductor wafer including an insulating layer disposed over a silicon substrate and said insulating layer defining a contact opening therein, said contact opening defining insulating side wall regions therein, said insulating side walls extending from an upper surface region of said insulating layer to an exposed silicon region of said silicon substrate, said process comprising:

introducing a set of reactants into said reaction chamber;

generating a RF plasma in the vicinity of said semiconductor wafer and regulating temperature and pressure of said reaction chamber, wherein said RF plasma is generated at a power of about 1000 W and said temperature of said reaction chamber is regulated in the range of between about 500° C. and about 700° C.;

controlling said introduction of said reactants, said generation of said RF plasma, and said regulation of said temperature and pressure so as to form a primary film over said upper surface region of said insulating layer, over said insulating side wall regions, and over said exposed silicon region of said silicon substrate, wherein said primary film is formed over said upper surface region and said insulating side wall regions according to the following chemical reaction $$TiCl_4 + H_2 \rightarrow Ti + A$$

wherein said primary film is formed over said exposed silicon region according to the following chemical reaction $$TiCl_4 + H_2 + Si \rightarrow TiSi + A$$

where Si represents silicon present in said silicon substrate and A represents a non-film forming component of said chemical reactions, wherein said primary film is characterized by a first thickness a over said upper surface region and a second thickness b over said exposed silicon region, and wherein said first thickness a is less than said second thickness b; and forming an electrical contact in said contact opening.

36. A process for forming an electrical contact to a silicon substrate as claimed in claim 35 wherein said process further comprises:

introducing a nitrogen-based gas into said reaction chamber; and generating a nitridizing RF plasma in the vicinity of said semiconductor wafer so as to nitridize said primary film formed over said upper surface region, said insulating side wall regions, and said exposed silicon region, wherein said nitridizing process causes conversion of said primary film formed over said upper surface region and said insulating side wall regions to a TiN layer, and said nitridizing process causes formation of a TiN passivation layer over said primary film formed over said exposed silicon region.

37. A process for forming an electrical contact to a silicon substrate as claimed in claim 35 wherein said electrical contact is formed by:

depositing a layer of conductive material over said portion of said primary film overlying said upper surface region and in said contact opening over said primary film;

removing the portion of said layer of conductive material overlying said portion of said primary film overlying said upper surface region, wherein said removal of said portion of said layer of conductive material is characterized by a process that is substantially less effective in removing said primary film; and removing said portion of said primary film following removal of said conductive material.

38. A process for forming an electrical contact to a silicon substrate, wherein a semiconductor wafer is positioned in a reaction chamber, said semiconductor wafer including an insulating layer disposed over a silicon substrate and said insulating layer defining a contact opening therein, said contact opening defining insulating side wall regions therein, said insulating side walls extending from an upper surface region of said insulating layer to an exposed silicon region of said silicon substrate, said process comprising:

introducing a set of reactants into said reaction chamber;

generating a RF plasma in the vicinity of said semiconductor wafer and regulating temperature and pressure of said reaction chamber, wherein said RF plasma is generated at a power of about 1000 W and said temperature of said reaction chamber is regulated in the range of between about 500° C. and about 700° C.;

controlling said introduction of said reactants, said generation of said RF plasma, and said regulation of said temperature and pressure so as to form a Ti film over said upper surface region of said insulating layer and over said insulating side wall regions and go as to form a TiSi film over said exposed silicon region of said silicon substrate, wherein said primary film is characterized by a first thickness a over said upper surface region and a second thickness b over said exposed silicon region, and wherein said first thickness a is less than said second thickness b; and forming an electrical contact in said contact opening.

39. A process for forming an electrical contact to a silicon substrate as claimed in claim 38 wherein said process further comprises:

introducing a nitrogen-based gas into said reaction chamber; and generating a nitridizing RF plasma in the vicinity of said semiconductor wafer so as to nitridize said primary film formed over said upper surface region, said insulating side wall regions, and said exposed silicon region, wherein said nitridizing process causes conversion of said primary film formed over said upper surface region and said insulating side wall regions to a TiN layer, and said nitridizing process causes formation of a TiN passivation layer over said primary film formed over said exposed silicon region.

40. A process for forming an electrical contact to a silicon substrate as claimed in claim 38 wherein said electrical contact is formed by:

depositing a layer of conductive material over said portion of said primary film overlying said upper surface region and in said contact opening over said primary film;

removing the portion of said layer of conductive material overlying said portion of said primary film overlying said upper surface region, wherein said removal of said portion of said layer of conductive material is characterized by a process that is substantially less effective in removing said primary film; and removing said portion of said primary film following removal of said conductive material.

41. A process for forming an electrical contact to a silicon substrate, wherein a semiconductor wafer is positioned in a reaction chamber, said semiconductor wafer including an insulating layer disposed over a silicon substrate and said insulating layer defining a contact opening therein, said contact opening defining insulating side wall regions therein, said insulating side walls extending from an upper surface region of said insulating layer to an exposed silicon region of said silicon substrate, said process comprising:

introducing a set of reactants and an inert gas into said reaction chamber;

generating a RF plasma in the vicinity of said semiconductor wafer and regulating temperature and pressure of said reaction chamber, wherein said RF plasma is generated at a power of about 1000 W and said temperature of said reaction chamber is regulated in the range of between about 500° C. and about 700° C.;

controlling said introduction of said reactants, said generation of said RF plasma, and said regulation of said temperature and pressure so as to form a primary film over said upper surface region of said insulating layer, over said insulating side wall regions, and over said exposed silicon region of said silicon substrate, wherein said primary film is formed over said upper surface region and said insulating side wall regions according to the following chemical reaction $$TiCl_4 + H_2 \rightarrow Ti + A$$

wherein said primary film is formed over said exposed silicon region according to the following chemical reaction $$TiCl_4 + H_2 + Si \rightarrow TiSi + A$$

where Si represents silicon present in said silicon substrate and A represents a non-film forming component of said chemical reactions, wherein said primary film is characterized by a first thickness a over said upper surface region and a second thickness b over said exposed silicon region, and wherein said first thickness a is less than said second thickness b;

purging said reaction chamber of $TiCl_4$;

introducing a nitrogen-based gas into said reaction chamber;

generating a nitridizing RF plasma in the vicinity of said semiconductor wafer so as to nitridize said primary film formed over said upper surface region, said insulating side wall regions, and said exposed silicon region, wherein said nitridizing process causes conversion of said primary film formed over said upper surface region and said insulating side wall regions to a TiN layer, and said nitridizing process causes formation of a TiN passivation layer over said primary film formed over said exposed silicon region; and forming an electrical contact in said contact opening.

42. A process for forming an electrical contact to a silicon substrate as claimed in claim 41 wherein said electrical contact is formed by:

depositing a layer of conductive material over said portion of said primary film overlying said upper surface region and in said contact opening over said primary film;

removing the portion of said layer of conductive material overlying said portion of said primary film overlying said upper surface region, wherein said removal of said portion of said layer of conductive material is characterized by a process that is substantially less effective in removing said primary film; and removing said portion of said primary film following removal of said conductive material.

* * * * *

UNITED STATES PATENT AND TRADEMARK OFFICE
CERTIFICATE OF CORRECTION

PATENT NO. : 6,365,515 B1
DATED : April 2, 2002
INVENTOR(S) : Srinivasan et al.

It is certified that error appears in the above-identified patent and that said Letters Patent is hereby corrected as shown below:

<u>Title page,</u>
ABSTRACT, reads as "generation e RF plasma", should read -- generation of the RF plasma --.

<u>Column 9,</u>
Line 5, reads as, "said upper surface regional,", should read -- said upper surface region, --.

<u>Column 16,</u>
Line 24, reads as, "regions and go", should read -- regions and so --.

Signed and Sealed this

Eighteenth Day of June, 2002

*Attest:*

*Attesting Officer*

JAMES E. ROGAN
*Director of the United States Patent and Trademark Office*